United States Patent
Kang et al.

(10) Patent No.: US 6,537,411 B1
(45) Date of Patent: *Mar. 25, 2003

(54) METHOD FOR LOW TEMPERATURE LAMINATION OF METALS TO POLYIMIDES

(75) Inventors: En-Tang Kang, Singapore (SG); Arthur Khoon Siah Ang, Singapore (SG); Koon Gee Neoh, Singapore (SG); Cheng Qiang Cui, Singapore (SG); Thiam Beng Lim, Singapore (SG)

(73) Assignees: The National University of Singapore, Singapore (SG); Institute of Microelectronics, Singapore (SG)

( * ) Notice: Subject to any disclaimer, the term of this patent is extended or adjusted under 35 U.S.C. 154(b) by 170 days.

This patent is subject to a terminal disclaimer.

(21) Appl. No.: 09/604,960

(22) Filed: Jun. 28, 2000

(30) Foreign Application Priority Data

Jun. 29, 1999 (SG) ............................................. 9903218

(51) Int. Cl.[7] ............................................. B32B 31/12
(52) U.S. Cl. ................................. 156/272.6; 156/308.6; 156/309.3; 427/536
(58) Field of Search .......................... 156/272.2, 272.6, 156/308.6, 309.3; 428/420, 458, 473.5; 525/422, 423, 426, 430; 427/400, 535, 536

(56) References Cited

U.S. PATENT DOCUMENTS

| 4,382,101 A | 5/1983 | Polak |
| 4,755,449 A | 7/1988 | Inoue et al. |
| 4,775,449 A | 10/1988 | Dumas et al. |
| 4,842,946 A | 6/1989 | Foust et al. |
| 5,306,741 A | 4/1994 | Chen et al. |
| 6,334,926 B1 * | 1/2002 | Kang et al. ............... 156/272.2 |

FOREIGN PATENT DOCUMENTS

| EP | 0310803 A1 | 4/1989 |
| EP | 0310803 B1 | 4/1989 |
| EP | 0 369 408 A2 | 5/1990 |
| EP | 0388888 A2 | 9/1990 |
| EP | 0388888 A3 | 9/1990 |
| EP | 0419845 A3 | 4/1991 |
| EP | 0419845 A2 | 4/1991 |
| EP | 0 419 845 A2 | 4/1991 |
| EP | 0456972 A1 | 11/1991 |
| EP | 0456972 B1 | 11/1991 |
| EP | 0478975 A2 | 4/1992 |
| EP | 0478975 A3 | 4/1992 |
| JP | 61111531 A | 5/1986 |
| JP | 61116531 A | 6/1986 |
| JP | 1132772 A | 5/1989 |
| JP | 2-289665 A | 11/1990 |
| JP | 3150392 A | 6/1991 |
| JP | 4064280 A | 2/1992 |
| JP | 4072070 A | 3/1992 |
| JP | 4359585 A | 12/1992 |
| JP | 5001160 A | 1/1993 |
| JP | 6279996 A | 10/1994 |
| JP | 6-316759 A | 11/1994 |
| JP | 7070335 A | 3/1995 |
| JP | 7186324 A | 7/1995 |
| JP | 7316776 A | 12/1995 |
| JP | 7317776 A | 12/1995 |
| JP | 8-197695 A | 8/1996 |
| JP | 8230108 A | 9/1996 |
| JP | 8325713 A | 12/1996 |
| JP | 1125779 A | 1/1999 |
| SU | 315079 | 10/1971 |

OTHER PUBLICATIONS

Egitto et al., "Oxygen plasma modification . . . ", *Plasma Surface Modification of Polymers: Relevance to Adhesion*, Editor: M. Strobel, et al., pp. 231–253, 1994.

Inagaki et al., "Improved Adhesion Between . . . ", *Plasma Surface Modification of Polymers: Relevance to Adhesion*, Editor: M. Strobel, et al., pp. 275–290, 1994.

Mukerji, et al., "Polyimides for Electronics Applications", *Polymers for Advanced Technologies*, vol. 4, pp. 309–315, 1992.

Sacher et al., "Metallization of Polymers", *ACS Symposium Series*, vol. 440, pp. 1–7, 1990.

Charbonnier et al., "Surface modification of poly . . . ", *Polymer Surface Modification: Relevance to Adhesion*, vol. 2., Editor: K.L. Mittal, pp. 3–27, 2000.

Tatoulian et al., "Copper metallization of plasma–treated . . . ", *Polymer Surface Modification: Relevance to Adhesion*, vol. 2., Editor: K.L. Mittal, pp. 183–197, 2000.

* cited by examiner

Primary Examiner—Michael W. Ball
Assistant Examiner—John T. Haran
(74) Attorney, Agent, or Firm—Birch, Stewart, Kolasch & Birch, LLP

(57) ABSTRACT

The present invention is directed to a method for the lamination of metals, and especially copper, to the surface of polyimides and derivatives of polyimides at temperatures substantially below the curing temperature of the imide polymers. More specifically, the invention is directed to a method for surface modification of polyimides and derivatives of polyimides by thermal graft copolymerization and interfacial polymerization with concurrent lamination of the metal of interest in the presence of an appropriate functional monomer. The process can be carried out under atmospheric conditions and either in the presence or the complete absence of an added polymerization initiator. The so laminated polyimide-metal interfaces exhibit T-peel adhesion strengths in excess of 16 N/cm. The adhesion strength also exceeds the fracture strength of polyimide films with a thickness of 75 μm.

14 Claims, No Drawings

METHOD FOR LOW TEMPERATURE LAMINATION OF METALS TO POLYIMIDES

BACKGROUND OF THE INVENTION

1. Field of the Invention

Polyimides and derivatives of polyimides are of great importance to the microelectronics packaging and encapsulation industries. This invention relates to a method for the low temperature lamination of metals, especially copper, to the surface of polyimides and derivatives of polyimides.

When thermally induced grafting or graft copolymerization occurs on the pristine or the pre-activated surface and interface of polyimides or derivatives of polyimides in contact with a metal surface, lamination occurs simultaneously. The surface and interfacial polymerization or graft copolymerization with concurrent lamination of the metal are carried out under atmospheric conditions, and in the complete absence of an added polymerization initiator or system degassing. Polymerization initiators may also be used to enhance the graft copolymerization reaction. The process and properties can be imparted on surfaces of pristine or pre-activated polyimides and derivatives of polyimides in contact with a preferred metal.

Thermal grafting or graft copolymerization with concurrent lamination can be carried out in the presence of one or more functional monomers including, but not limited to, 1-vinyl imidazole (VIDZ), 1-ally imidazole (AIDZ), 2-vinyl pyridine (2VP), 4-vinyl pyridine (4VP), 2,4,6-triallyoxy-1,3,5-triazine, trially-1,3,5-benzenetricarboxylate, epoxide-containing monomers, monomers of polyelectrolyte and polyampholyte.

The lap shear adhesion strength of the so-laminated polyimide-copper interface can readily exceed the fracture strength of the substrate polyimide film. The T-peel adhesion strengths of the so-laminated polyimide-copper interfaces are greater than 16 N/cm, with delamination occurs via cohesive failure in the polymer film. The strong adhesion between the polymer and the metal arises from the strong adhesion/adsorption of the functional chains and the covalent tethering of the grafted functional chains on the surfaces of polyimides or derivatives of polyimide on one hand, and the strong adhesion, with or without charge transfer interaction, of the grafted functional chains to the metal surface on the other. Strong adhesion of the metal to the polymer depends on the proper annealing of the polyimide-copper interface after thermal grafting, interfacial polymerization and lamination.

The present invention distinguishes itself from prior art lamination of metals to polyimides in that the one-step grafting/lamination process is carried out at temperature substantially below the melt processing and curing temperatures of the polyimides, does not involve the polyamic acid precursor and no adhesive is required to affect the lamination process.

2. Description of Related Arts

Polyimides are considered specialty plastics because of their outstanding, high performance engineering properties particularly suited for the microelectronics packaging industries and composite applications. Polyimides offer good thermal and mechanical stability, low dielectric constants and chemical resistance. Polyimides for electronic applications have been reviewed by P. K. Mukerji and G. Demet in *Polym. Adv. Technol.* 4, 309 (1992). Good adhesion of polyimides to metals, copper in particular, is essential for applications in microelectronics. Depending on the configuration of the particular assembly, the copper metal is either introduced onto the polyimide surface through vacuum evaporation/deposition, or by means of the direct lamination of the metal foil, films or sheet to the polymer surface.

The strategies of surface chemical and physical modification have been widely implemented in polyimides and other polymers for adhesion improvement with metals and with other polymer substrates. They have been described, for example in, E. Sacher, J. J. Pireaux and S. P. Kowalczyk (Eds.), *Metallization of Polymers,* ACS Symposium Series 440, Am. Chem. Soc., Washington, D.C. (1990); in M. Strobel, C. S. Lyons and K. L. Mittal (Eds.), *Plasma Surface Modification of Polymers: Relevance to Adhesion,* VSP, Zeist, The Netherlands (1994); and in K. L. Mittal (Ed.), *Polymer Surface Modification: Relevance to Adhesion,* VSP, Zeist, The Netherlands (1995).

The patent literature contains numerous disclosures of surface modification of polyimides for adhesion enhancement. However, most of the prior art is related to plasma or chemical surface treatment. A few of the prior art disclosures are related to surface modification via graft copolymerization. Almost no prior art is directed to the modification of polyimides via surface graft copolymerization for the improvement of adhesion to metals. Throughout our exhaustive patent literature search, there is no relevant process which involves the simultaneous modification of polyimide surface via grafting or graft copolymerization and the lamination of a metal in the complete absence of an adhesive.

For further background reading, reference is made to the following patent publications:

European Patent Nos. 310803, 388888, 419845, 456972 and 478975;

U.S. Pat. Nos. 4,382,101, 4,775,449 and 4,842,946;

British Patent publication No. 9004392;

Japanese Patent Publication Nos. 1132772, 3150392, 4072070, 5001160, 7070335, 61116531A, 90-025779, 04-359585, 04064280, 06-316759, 06-279996, 07-186324, 7316776A, 08-230108, 08-325713; and Russian Patent Publication Nos. 262015, 315079 and 339042.

SUMMARY OF THE INVENTION

It is an object of the present invention to provide a new method for the low temperature direct lamination of a metal, such as copper, to surfaces of polyimides under atmospheric conditions. It is also an object of the present invention to effect the said lamination in the absence of an added adhesive. These and other objects and advantages of the present invention are obtained by providing a method for modification of pristine, pretreated, or preactivated polyimide surfaces via low temperature thermal graft copolymerization or interfacial polymerization of an appropriate functional monomer in the presence of the contacting metal. A desirable low grafting/lamination temperature is selected to be substantially below the melting or curing temperature of the polyimides. Desirable radio frequency gas plasma with low plasma power is selected for the pretreatment of the polyimides to minimize the undesirable over-oxidation, etching or sputtering of the polyimide surface. The surfaces of the polyimides can also be activated by corona discharge, ozone treatment, UV irradiation and electron beam bombardment.

The objects and advantages of the present invention can be achieved when the monomer used for the surface graft copolymerization or interfacial polymerization with concurrent lamination are selected from a group of vinyl monomers which contain nitrogen heteroatoms or nitrogen functionalities in the pendent group or groups. The monomers are also selected from the family containing multiple vinyl group functionalities, which can also promote chain crosslinking, as well as from the family which contains epoxide functional groups.

The objects and advantages of the present invention can be achieved when the monomer concentrations used for graft copolymerization or interfacial polymerization range from 2 to 100 weight per cent. Desirable solvents are selected from the group which provide good solubility for the vinyl monomer, and which promote free radical polymerization.

The objects and advantages of the present invention are obtained when the monomers used for the simultaneous interfacial polymerization grafting and lamination process also contains a small quantity of a polymerization initiator. The initiators are selected from the families of organic peroxides, hydroperoxides, azo and diazo compounds, and the like.

The objects and advantages of the present invention are obtained when the metals for lamination are preferably selected from copper metal and its alloys.

The objects and advantages of the present invention are obtained when the polymers for lamination are selected from polyimides and their derivatives.

The objects and advantages of the present invention are best achieved when the polyimide-metal interfaces from the thermal graft copolymerization and interfacial polymerization with concurrent lamination are returned to room temperature via a slow cooling or annealing process.

DESCRIPTION OF PREFERRED EMBODIMENTS

The present invention is directed to a method of direct lamination of a metal, such as copper, to polyimides in the absence of an applied adhesive and at temperature substantially below the glass transition temperature or melting point of polyimides. The lamination strengths, as measured in terms of T-peel strength, of the polyimides-metal interfaces can exceed the fracture strength of a 75 µm thick Kapton® HN film. While not wishing to be bound by any theory, it is believed that the functional groups of the physicochemically adsorbed and covalently grafted polymer chains on the polyimide surface charge transfer interact with the contacting metal surface to give rise to the strong adhesion between the metal and the polymer. The lamination temperature in the present invention is thus governed by the optimum temperature for thermally induced surface graft copolymerization and interfacial polymerization. More precisely, the simultaneous interfacial polymerization, grafting and lamination process at the polyimides-metal interface is affected by the thermal decomposition of the peroxides and hydroxyl peroxides at the polymer surface and interface, and the initiators in the monomer phase.

In the preferred method, the polyimides surface is preactivated by gas plasma treatment, ozone treatment, corona discharge treatment, or ultra-violet irradiation, although pristine polyimides can also be used. The pristine and preactivated polyimides are then subjected to thermally induced graft copolymerization and interfacial polymerization with reactive vinyl monomers in the presence of a contacting metal. The graft copolymerization and interfacial polymerization are also enhanced by the presence of an initiator at the polymer-metal interface or in the monomer solution.

The preferred monomers are selected from the family of vinyl polymers with functional groups which are capable of undergoing charge transfer interactions with the contacting metal. Thus, the monomers are selected from the family containing the imidazole, epoxide, anionic, cationic or amphoteric functional groups. The concentration of monomers used for the grafting/lamination process typically range from 2 to 100 weight percent. The graft copolymerization with concurrent lamination process is aided by the presence of a small amount, typically in the range of 0.1 wt. % to 5 wt. %, of a crosslinking agent for vinyl polymerization. The preferred crosslinking agents are selected from the family containing multiple vinyl groups or functionalities.

The preferred application and the best advantages of the present invention are obtained from polyimide films or sheets, as well as from copper foils, films, thin sheets or plates. Thus, in the preferred method, the surface of the polyimides is pretreated with a radio frequency gas plasma, corona discharge or ozone. Pristine (untreated) polyimide surface is grafted/laminated at lower efficiency than its pretreated counter-parts. The efficiency, however, can be improved by the presence of an initiator. The initiators are selected from the families of organic peroxides, hydroperoxides, azo and diazo compound. The selection of frequency and gas type (in the case of plasma treatment) and treatment time for all treatments are important. Long pretreatment time can result in excessive etching or degradation of the polymer surface. The preferred temperature for the present interfacial polymerization, grafting and lamination process is usually less than 130° C. under atmospheric conditions and either in the presence or in the complete absence of an added polymerization initiator.

EXAMPLES

The following specific examples are provided to illustrate this invention and the manner in which it may be carried out. It will be understood, however, that the specific details given in each example have been selected for purpose of illustration and are not to be constructed as a limitation on the invention. Example 1 provides more details on the conduct of the simultaneous surface graft copolymerization, interfacial polymerization and lamination experiment.

Example 1

In a preferred experimental scale process, an Ar plasma pretreated polyimide film, e.g. a Kapton® HN film, of 0.5 cm×0.25 cm in size and 75 µm in thickness and a 0.1 mm thick copper foil of similar size was lapped together in the presence of a small quantity of Ivinyl imidazole (VIDZ). The surface of the copper metal was cleaned with a mixture of aqueous 0.01 M HCl/0.01 M $HNO_3$/0.01 M $H_2SO_4$ in the volume proportion of 6:1:1, respectively, before use. The polyimide/VIDZ/Cu assembly was sandwiched between two stainless steel plates and subjected to an equivalent pressure of no less than 10 N/cm$^2$ in an hydraulic press. The assembly under pressure was also subjected to thermal graft copolymerization, interfacial polymerization and lamination at 120° C. for 2–4 h, with the heat being provided by a pair of heating plates. After the grafting. polymerization and lamination process at 120° C., the assembly was allowed to returned to room temperature slowly between the two heating plates over a period of no less than 6 h. The polyimide-Cu joint so prepared exhibited a T-peel strength exceeding 16 N/cm or exceeding the fracture strength of the 75 µm thick Kapton® HN film.

Example 2

In a preferred lamination experiment, a polyimide/VIDZ/Cu assembly is similarly prepared as illustrated in Example 1, except the VIDZ monomer also contains a small quantity of a crosslinking agent, e.g. 2 vol. % of trially-1,3,5-benzenetricarboxylate. In the presence of the crosslinking agent, a T-peel strength exceeding the fracture strength of a 75 μm thick Kapton® HN film is achieved at a lamination temperature of 100° C. or less.

Example 3

A similar lamination experiment as that illustrated in Example 2, except that the crosslinking agent is replaced by 2,4,6-triallyoxy-1,3,5-triazine is also carried out. In the presence of the crosslinking agent, a T-peel strength exceeding 16 N/cm or exceeding the fracture strength of a 75 μm thick Kapton® HN film is achieved at a lamination temperature of 100° C. or less. Furthermore, in the presence of the crosslinking agent, the adhesion strength of the polyimide-Cu joint remains practically unchanged even after prolonged (>10 days) immersing/soaking in water.

Example 4

In another preferred experiment, a pristine polyimide film is lapped together with a Cu foil of similar size in the presence of a small quantity of pure VIDZ, VIDZ plus 2 vol. % trially-1,3,5-benzenetricarboxylate, or VIDZ plus 2 vol. % of 2,4,6-triallyoxy-1,3,5-triazine. For lamination carried out at 120° C., T-peel strengths exceeding 4, 9, and 11 N/cm are obtained, respectively, for the three cases.

Example 5

In yet another preferred experiment, a pristine polyimide film is lapped together with a Cu foil of similar size in the presence of a small quantity of the VIDZ monomer, containing also 0.5 to 1 wt. % of a peroxide initiator, such as the benzoyl peroxide. For lamination carried out at 100° C., T-peel strength exceeding the fracture strength of a 75 μm thick Kapton® HN film is achieved.

Example 6

In another preferred experiment, an Ar plasma pretreated polyimide film is lapped together with Cu foil of similar size in the presence of a small quantity of VIDZ containing 2 vol. % trially-1,3,5-benzenetricarboxylate. For lamination carried out at 80° C., a T-peel strength of no less than 12 N/cm is obtained even at this low lamination temperature.

Example 7

In yet another preferred lamination experiment, an Ar plasma pretreated polyimide film is lapped together with a Cu foil of similar size in the presence of a small quantity of 4-vinyl pyridine. The lamination, grafting and interfacial polymerization is allowed to proceed at 120° C. for 2–4 h in a hot press. A T-peel strength of no less than 3 N/cm is obtained. The T-peel strength is increased to more than 6 N/cm in the presence of a small quantity of a crosslinking agent, e.g. in the presence of 2 vol. % 2,4,6-triallyoxy-1,3,5-triazine.

Example 8

In yet another preferred lamination experiment, an Ar plasma pretreated polyimide film is lapped together with a Cu foil of similar size in the presence of a small quantity of acryloyl morpholine. The lamination, grafting and interfacial polymerization are allowed to proceed at 120° C. for 2–4 h in a hot press. A T-peel strength of no less than 3 N/cm is obtained. The T-peel strength is increased to more than 6 N/cm in the presence of a small quantity of a crosslinking agent, e.g. in the presence of 2 vol. % 2,4,6-triallyoxy-1,3,5-triazine.

Example 9

In still another preferred lamination experiment, an Ar plasma pretreated polyimide film is lapped together with an aluminium foil of 0.1 mm in thickness in the presence of a small quantity of glycidyl methacrylate (GMA). The lamination, grafting and interfacial polymerization are allowed to proceed at 120° C. for 2–4 h in a hot press. A T-peel strength of no less than 2 N/cm is obtained. The T-peel strength is increased to more than 6 N/cm when the monomer composition also include a small quantity of a crosslinking agent, e.g. 2 vol. % trially-1,3,5-benzenetricarboxylate.

Example 10

In still another preferred lamination experiment, an Ar plasma pretreated polyimide film is lapped together with Cu foil of similar size in the presence of a small quantity of 1-allyl imidazole. The lamination, grafting and interfacial polymerization are allowed to proceed at 120° C. for 2–4 h in a hot press. A T-peel strength of no less than 8 N/cm is obtained.

The T-peel strength is increased to more than 12 N/cm when the monomer composition also include a small quantity of a crosslinking agent, such a 2 vol. % trially-1,3,5-benzenetricarboxylate or 2 vol. % 2,4,6-triallyoxy-1,3,5-triazine.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

What is claimed is:

1. A method for laminating a metal to a polyimide or to a polyimide derivative comprising:
    i) subjecting the polyimide or polyimide derivative to thermal graft copolymerization and to interfacial polymerization in the presence of the metal;
    ii) laminating the metal and the polyimide or polyimide derivative in the presence of a functional monomer;
    wherein steps i) and ii) are performed simultaneously and at a temperature below the glass transition temperature, melting point or curing temperature of the polyimide or polyimide derivative.

2. The method of claim 1, in which the laminating and interfacial polymerizing reactions are performed under atmospheric conditions and at a temperature below 130° C.

3. The method of claim 1, in which the metal is selected from copper, gold, palladium or nickel and is in the form of a film, foil or thin slab.

4. The method of claim 1, wherein the polyimide or polyimide derivative is in the form of a film, sheet, slab, fiber or porous substrate.

5. The method of claim 1, wherein a polyimide derivative is laminated and the polyimide derivative is pretreated with a gas plasma, ozone, a corona discharge, ultraviolet irradiation or electron beam bombardment.

6. The method of claim 2, wherein a polyimide derivative is laminated and the polyimide derivative is pretreated with a gas plasma, ozone, a corona discharge, ultraviolet irradiation or electron beam bombardment.

7. The method of claim 5, in which the metal is selected from copper, gold, palladium or nickel and is in the form of a film, foil or thin slab.

8. The method of claim 1, wherein the polyimide or polyimide derivative is used in pristine form.

9. The method of claim 2, wherein the polyimide or polyimide derivative is used in pristine form.

10. The method of any one of claims 1–9 wherein the interfacial polymerization reaction is performed in the complete absence of an added polymerization initiator.

11. The method of any one of claims 1–9, wherein the functional monomer is a vinyl monomer comprising a nitrogen heteroatom or a nitrogen functionality in at least one pendant group or comprising an epoxide functional group.

12. The method of claim 11, wherein the functional monomer is 1-vinyl imidazole, 1-allyl imidazole, 2-vinyl pyridine, 4-vinyl pyridine, acryloyl morpholine, glycidyl methacrylate or allyl glycidyl ether.

13. The method of any one of claims 1–9, wherein the interfacial polymerization reaction is performed using a crosslinking reagent that is triallyl-1,3,5-benzenecarboxylate, 2,4,6-triallyloxy-1,3,5-triazine or 1,2,4-trivinylcyclohexane.

14. The method of claim 1, wherein the concentration of monomer used for at least one of the graft copolymerization and interfacial polymerization reactions is from 2 to 100 weight percent of the reaction mixture.

* * * * *